United States Patent
Chuang et al.

(10) Patent No.: US 8,804,445 B2
(45) Date of Patent: Aug. 12, 2014

(54) OSCILLATO BASED ON A 6T SRAM FOR MEASURING THE BIAS TEMPERATURE INSTABILITY

(75) Inventors: Ching-Te Chuang, New Taipei (TW); Shyh-Jye Jou, Hsinchu County (TW); Wei Hwang, Taipei (TW); Ming-Chien Tsai, Kaohsiung (TW); Yi-Wei Lin, New Taipei (TW); Hao-I Yang, Taipei (TW); Ming-Hsien Tu, Tainan (TW); Wei-Chiang Shih, Taipei (TW); Nan-Chun Lien, Hsinchu (TW); Kuen-Di Lee, Kinmen County (TW)

(73) Assignee: National Chiao Tung University, Hsinchu (TW)

( * ) Notice: Subject to any disclaimer, the term of this patent is extended or adjusted under 35 U.S.C. 154(b) by 329 days.

(21) Appl. No.: 13/484,648

(22) Filed: May 31, 2012

(65) Prior Publication Data
US 2013/0222071 A1    Aug. 29, 2013

(30) Foreign Application Priority Data

Feb. 24, 2012   (TW) .............................. 101106198 A

(51) Int. Cl.
*G11C 7/04* (2006.01)
*G11C 29/12* (2006.01)

(52) U.S. Cl.
USPC .............................. 365/201; 365/154; 331/57

(58) Field of Classification Search
USPC .............................. 365/201, 154, 211; 331/57
See application file for complete search history.

(56) References Cited

U.S. PATENT DOCUMENTS

| 7,483,322 | B2 * | 1/2009 | Joshi et al. ..................... 365/201 |
| 7,924,640 | B2 * | 4/2011 | Deng et al. ..................... 365/201 |
| 7,948,261 | B2 * | 5/2011 | Kawakami ....................... 326/12 |
| 2009/0046519 | A1 * | 2/2009 | Wang et al. ............. 365/189.09 |
| 2010/0046276 | A1 * | 2/2010 | Chen et al. ..................... 365/154 |
| 2013/0223136 | A1 * | 8/2013 | Chuang et al. ................ 365/154 |
| 2013/0293250 | A1 * | 11/2013 | McMahon et al. ......... 324/750.3 |

OTHER PUBLICATIONS

Ming-Chien Tsai et al.; Embedded SRAM Ring Oscillator for In-Situ Measurement of NBTI and PBTI Degradation in CMOS 6T SRAM Array; Apr. 23-25, 2012; Publish: 2012 VLSI-TSA & VLSI-DAT.

* cited by examiner

*Primary Examiner* — Harry W Byrne
*Assistant Examiner* — Lance Reidlinger
(74) *Attorney, Agent, or Firm* — Bacon & Thomas, PLLC

(57) ABSTRACT

The present invention provides an oscillator which is based on a 6T SRAM for measuring the Bias Temperature Instability. The oscillator includes a first control unit, a first inverter, a second control unit, and a second inverter. The first control unit is coupled with the first inverter. The second control unit is coupled with the second inverter. The first control unit and the second control unit is used to control the first inverter and the second inverter being selected, biased, and connected respectively, so that the NBTI and the PBTI of the SRAM can be measured separately, and the real time stability of the SRAM can be monitored immediately.

9 Claims, 4 Drawing Sheets

OSCILLATO BASED ON A 6T SRAM FOR MEASURING THE BIAS TEMPERATURE INSTABILITY

BACKGROUND OF THE INVENTION

1. Field of the Invention

The present invention relates to the design of an integrated circuit, particularly to an oscillator based on a 6T SRAM for measuring the Positive Bias Temperature Instability and the Negative Bias Temperature Instability.

2. Description of the Prior Art

The reliability test of the integrated circuit depends on the reliability of the semiconductor device basically. The reliability is a very important factor to the integrated circuit. As for current nano-device, the reliability plays a very important role to the smaller device and more complicated circuit.

There are three kinds of reliability analysis mainly, including the Time Dependent Dielectric Breakdown (TDDB), the hot-carrier effect of device channel and electromigration effect of metal wire. The hot-carrier effect is the most important conventional reliability analysis. However, as the supply voltage is dropping constantly, the hot-carrier effect is also dropping constantly, therefore the hot carrier has not already been the No. 1 killer of reliability, and the substitute is the Bias Temperature Instability. The Bias Temperature Instability includes the Negative Bias Temperature Instability (NBTI) and the Positive Bias Temperature Instability (PBTI). Among these, the Negative Bias Temperature Instability (NBTI) is caused by the P-type metal-oxide-semiconductor (PMOS) transistor, and the Positive Bias Temperature Instability (PBTI) is caused by the N-type metal-oxide-semiconductor (NMOS) transistor.

The Bias Temperature Instability will cause the variation of critical voltage of transistor. For example, when a negative voltage is applied on the gate, the critical voltage of P-type metal-oxide-semiconductor (PMOS) transistor will be reduced with respect to time. The variation of critical voltage is a great challenge to the operation of integrated circuit. Due to the critical voltage represents the voltage required to open the transistor in the circuit design, the variation represents the uncertain state of transistor and the risk of circuit operation.

It is found by the conventional research that the effect of the Negative Bias Temperature Instability (NBTI) on the P-type metal-oxide-semiconductor (PMOS) transistor is much severer than the effect of the Positive Bias Temperature Instability (PBTI) on the N-type metal-oxide-semiconductor (NMOS) transistor. However, the high-K material and metal gate technique are adopted in 45 nm complementary metal-oxide-semiconductor (CMOS) process. At this time, the importance of the Positive Bias Temperature Instability (PBTI) and the Negative Bias Temperature Instability (NBTI) is the same, but the effect and mechanism of the Positive Bias Temperature Instability (PBTI) and the Negative Bias Temperature Instability (NBTI) are different. Thus, an oscillator based on a 6T SRAM is required to measure the Positive Bias Temperature Instability (PBTI) and the Negative Bias Temperature Instability (NBTI), in order to help the circuit designers to realize the dynamic and real-time change of long-term reliability.

SUMMARY OF THE INVENTION

A purpose of the present invention is to provide a SRAM cell based on 6 transistor structure to form a ring oscillator. There is no change of diffusion, poly materials and contact placement to ensure the same fundamental characteristics as original 6T SRAM cells. It is also able to measure the real-time change of reliability.

Based on the above-mentioned purpose, the present invention provides an oscillator based on a 6T SRAM for measuring the Bias Temperature Instability. The oscillator is composed of at least 4 SRAM cells, wherein the SRAM cell is formed by 6 transistor structure. Every SRAM cell includes a first inverter, a second inverter, a first pass-gate transistor and a second pass-gate transistor.

The first inverter includes a first pull-up transistor and a first pull-down transistor. The second inverter includes a second pull-up transistor and a second pull-down transistor, as well as a first pass-gate transistor and a second pass-gate transistor. The first pass-gate transistor is coupled with the first inverter. The second pass-gate transistor is coupled with the second inverter.

The oscillator includes a first control unit, a first inverter, a second control unit and a second inverter. The first control unit is electrically connected with the first inverter. The first control unit is used to control the first inverter being selected, biased, and connected respectively. The second inverter is electrically connected with the first inverter. The second control unit is electrically connected between the first control unit and the first inverter. The second control unit is used to control the second inverter being selected, biased, and connected respectively. The first control unit and the second control unit are used to measure the Negative Bias Temperature Instability and the Positive Bias Temperature Instability of the SRAM cell, and monitor the real-time reliability of the SRAM cell.

In order to understand the above-mentioned purposes, characteristics and advantages of present invention more obviously, the detailed explanation is described as follows with preferred embodiments and figures.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 1:
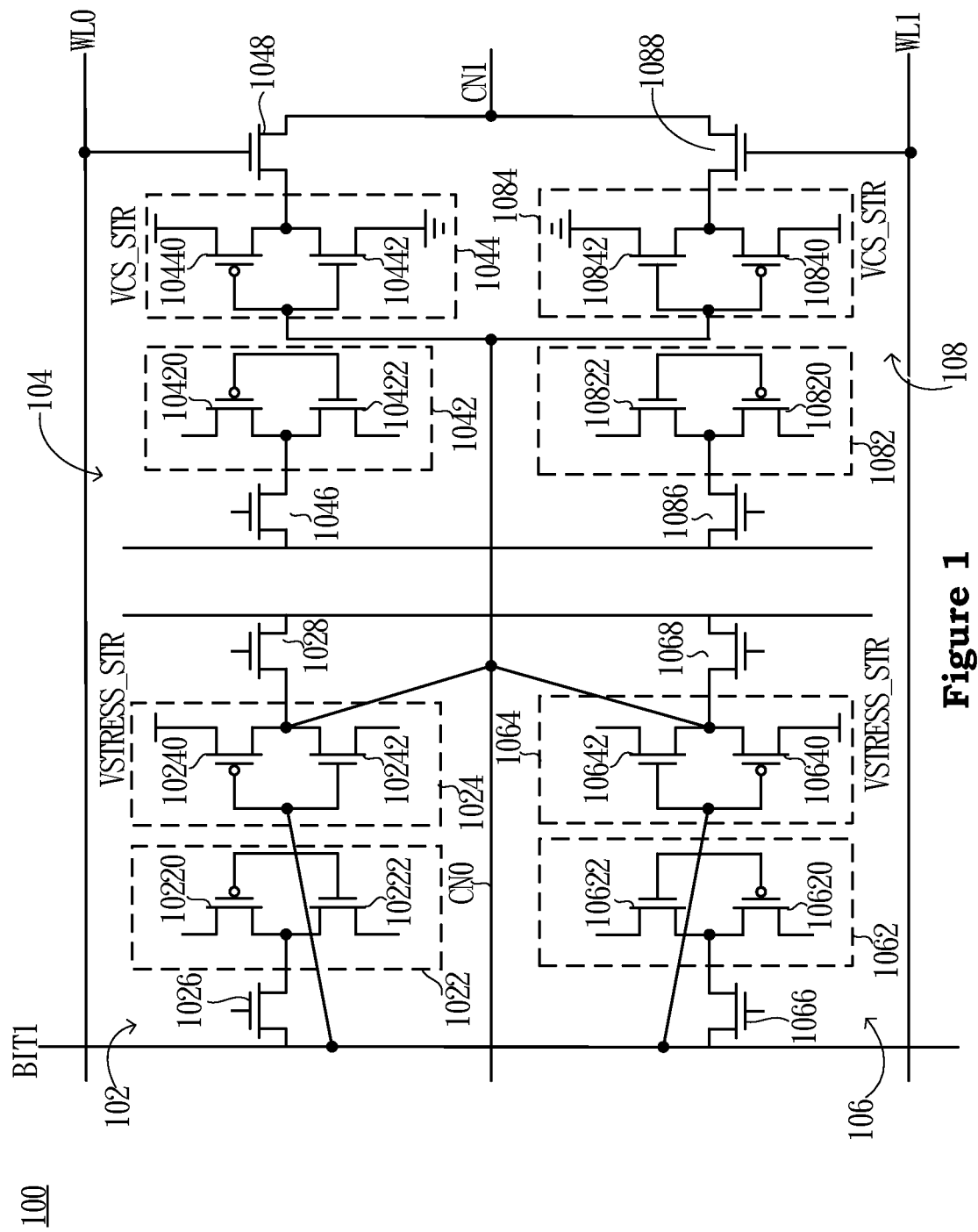
FIG. 1 is an illustration for an embodiment of ring oscillator according to the present invention.

Please referring to FIG. 1, which is an illustration for an embodiment of ring oscillator according to the present invention. The ring oscillator 100 includes a first SRAM 102, a second SRAM 104, a third SRAM 106 and a fourth SRAM 108. Among these, the first SRAM 102, the second SRAM 104, the third SRAM 106 and the fourth SRAM 108 are formed by 6 transistor structure. It has to describe that the ring oscillator 100 of the present invention is composed of four 6T SRAM cells. However, the number of RAM is not limited by four. As long as the ring oscillator is composed is composed of at least 4 SRAM cells, which will be included in the scope of ring oscillator 100 of the present invention.

Figure 2:
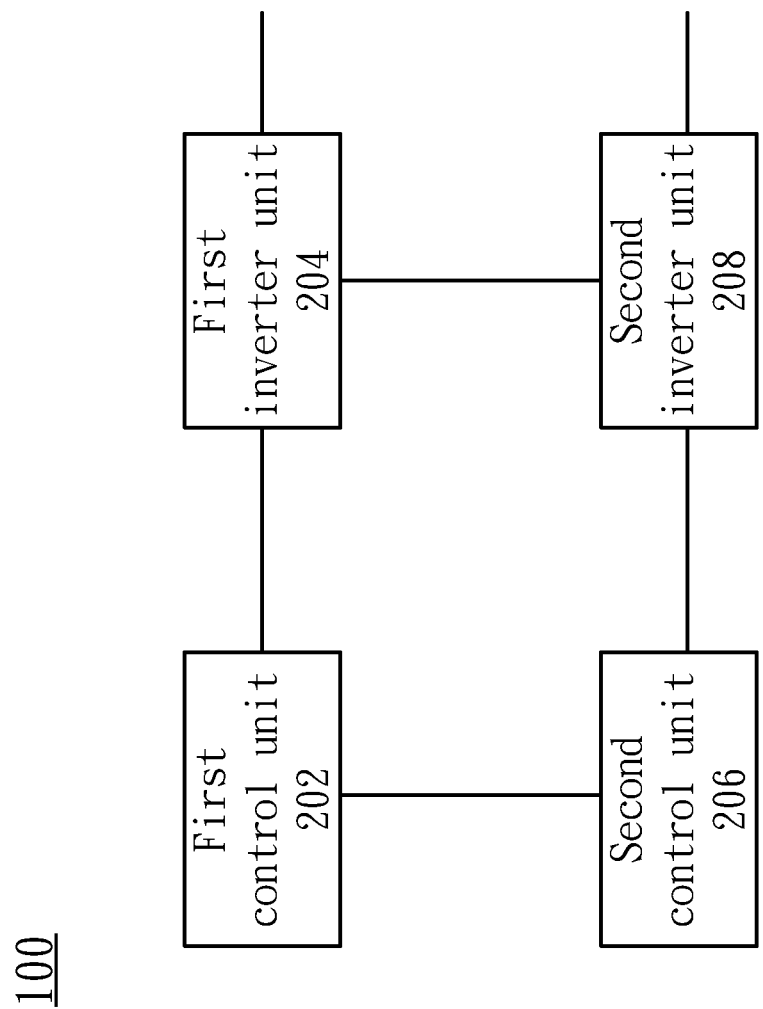
FIG. 2 is an illustration for the block diagram of ring oscillator according to the present invention.

In this embodiment, please referring to FIG. 2, which is an illustration for the block diagram of ring oscillator 100 according to the present invention. The ring oscillator 100 includes a first control unit 202, a first inverter 204, a second control unit 206 and a second inverter 208. The first control unit 202 is coupled with the first inverter 204 and the second control unit 206. The first control unit 202 is used to control the selected actions of the first inverter 204. The selected actions include selecting the first inverter 204, biasing the first inverter 204 and connecting the first inverter 204. The second control unit 206 is used to control the selected actions of the second inverter 208. The selected actions include selecting the second inverter 208, biasing the second inverter 208 and connecting the second inverter 208.

Please referring to FIG. 1 and FIG. 2, the ring oscillator 100 uses the first control unit 202 and the second control unit 206 to the first inverter 204 and the second inverter 208, respectively, so as to measure the Negative Bias Temperature Instability (NBTI) of the second SRAM 104 and the fourth SRAM 108 as well as the Positive Bias Temperature Instability (PBTI) of the second SRAM 104 and the fourth SRAM 108 separately, and monitor their influence on the stability. It has to describe that the present invention is composed of 6T SRAM structure, so, only part of 6T SRAM circuit is utilized. It can be observed from FIG. 1 that the bold heavy line and transistor represents the actual circuit for the embodiment of the present invention, and the light line and transistor represents the unused circuit.

Please referring to FIG. 1 and FIG. 2, the circuit of the present invention is based on standard 6T SRAM. The first SRAM 102 includes a first inverter 1022, a second inverter 1024, a first pass-gate transistor 1026 and a second pass-gate transistor 1028. The first inverter 1022 includes a first pull-up transistor 10220 and a first pull-down transistor 10222. The second inverter 1024 includes a second pull-up transistor 10240 and a second pull-down transistor 10242. The first pass-gate transistor 1026 is coupled with the first inverter 1022. The second pass-gate transistor 1028 is coupled with the second inverter 1024. As for an example of the first SRAM 102: The standard 6T is composed of 6 transistors (the first pull-up transistor 10220, the first pull-down transistor 10222, the second pull-up transistor 10240, the second pull-down transistor 10242) formed on the semiconductor substrate. Among these, there are four N-type metal-oxide-semiconductor (NMOS) transistors (the first pull-down transistor 10222, the second pull-down transistor 10242, the first pass-gate transistor 1026 and the second pass-gate transistor 1028) and two P-type metal-oxide-semiconductor (PMOS) transistors (the first pull-up transistor 10220 and the second pull-up transistor 10240).

Please referring to FIG. 1, the first control unit 202 is composed of a first SRAM 102. Among these, a voltage stress source VSTRESS_STR is applied to the drain of the second pull-up transistor 10240 in the first SRAM 102. The gate of the second pull-up transistor 10240 in the first SRAM 102 is coupled with a bit line BIT1.

Please referring to FIG. 1 and FIG. 2, the second SRAM 104 includes a first inverter 1042, a second inverter 1044, a first pass-gate transistor 1046 and a second pass-gate transistor 1048. The first inverter 1042 includes a first pull-up transistor 10420 and a first pull-down transistor 10422. The second inverter 1044 includes a second pull-up transistor 10440 and a second pull-down transistor 10442. The first pass-gate transistor 1046 is coupled with the first inverter 1042. The second pass-gate transistor 1048 is coupled with the second inverter 1044. The first control unit 202 is composed of the first SRAM 102.

Please referring to FIG. 2, the first inverter 204 is composed of the second SRAM 104. The second pass-gate transistor 1048 of the second SRAM 104 is coupled with the second inverter 1044 of the second SRAM 104. The second inverter 1044 of the second SRAM 104 is coupled with the drain of the second pull-up transistor 1440 in the first SRAM 102. A voltage control source VCS_STR is applied to the source of the second pull-up transistor 1440. The source of the second pull-down transistor 10442 is grounded. The gate of the second pass-gate transistor 1048 in the second SRAM 104 is coupled with the first word line WL0.

Please referring to FIG. 1, the third SRAM 106 includes a first inverter 1062, a second inverter 1064, a first pass-gate transistor 1066 and a second pass-gate transistor 1068. The first inverter 1062 includes a first pull-up transistor 10620 and a first pull-down transistor 10622. The second inverter 1064 includes a second pull-up transistor 10640 and a second pull-down transistor 10242. The first pass-gate transistor 1066 is coupled with the first inverter 1062. The second pass-gate transistor 1028 is coupled with the second inverter 1064.

Please referring to FIG. 1 and FIG. 2, the second control unit 206 is composed of a third SRAM 106 based on a 6T SRAM. Among these, the gate of the second pull-up transistor 10640 in the third SRAM 106 is coupled with the bit line BIT1. A voltage stress source VSTRESS_STR is applied to the source of the second pull-up transistor 10640 in the third SRAM 106. The drain of the second pull-up transistor 10240 in the first SRAM 102 is coupled with the drain of the second pull-up transistor 10640 in the third SRAM 106, and they are coupled with the input CN0 together.

Please referring to FIG. 1, the fourth SRAM 108 includes a first inverter 1082, a second inverter 1084, a first pass-gate transistor 1086 and a second pass-gate transistor 1088. The first inverter 1082 includes a first pull-up transistor 10820 and a first pull-down transistor 10822. The second inverter 1084 includes a second pull-up transistor 10840 and a second pull-down transistor 10842. The second pass-gate transistor 1088 is coupled with the second inverter 1084. The first pass-gate transistor 1086 is coupled with the first inverter 1082.

The second inverter shown in FIG. 2 is composed of the fourth SRAM 108 with 6T structure shown in FIG. 1. As shown in FIG. 1, the second pass-gate transistor 1088 of the fourth SRAM 108 is coupled with the second inverter 1084 of the fourth SRAM 108. The second inverter 1084 of the fourth SRAM 108 is coupled with the drain of the second pull-up transistor 10240 in the first SRAM 102 and the drain of the second pull-up transistor 10640 in the second SRAM 106. A voltage control source VCS_STR is applied to the source of the second pull-up transistor 10840 in the fourth SRAM 108. The source of the second pull-down transistor 10842 is grounded. The gate of the second pass-gate transistor 1088 in the fourth SRAM 108 is coupled with the second word line WL1. The source of the second pass-gate transistor 1048 in the second SRAM 104 is coupled with the source of the second pass-gate transistor 1088 in the fourth SRAM 108 as the output CN1, which is able to serially connect the ring oscillator of next stage.

Figure 3:
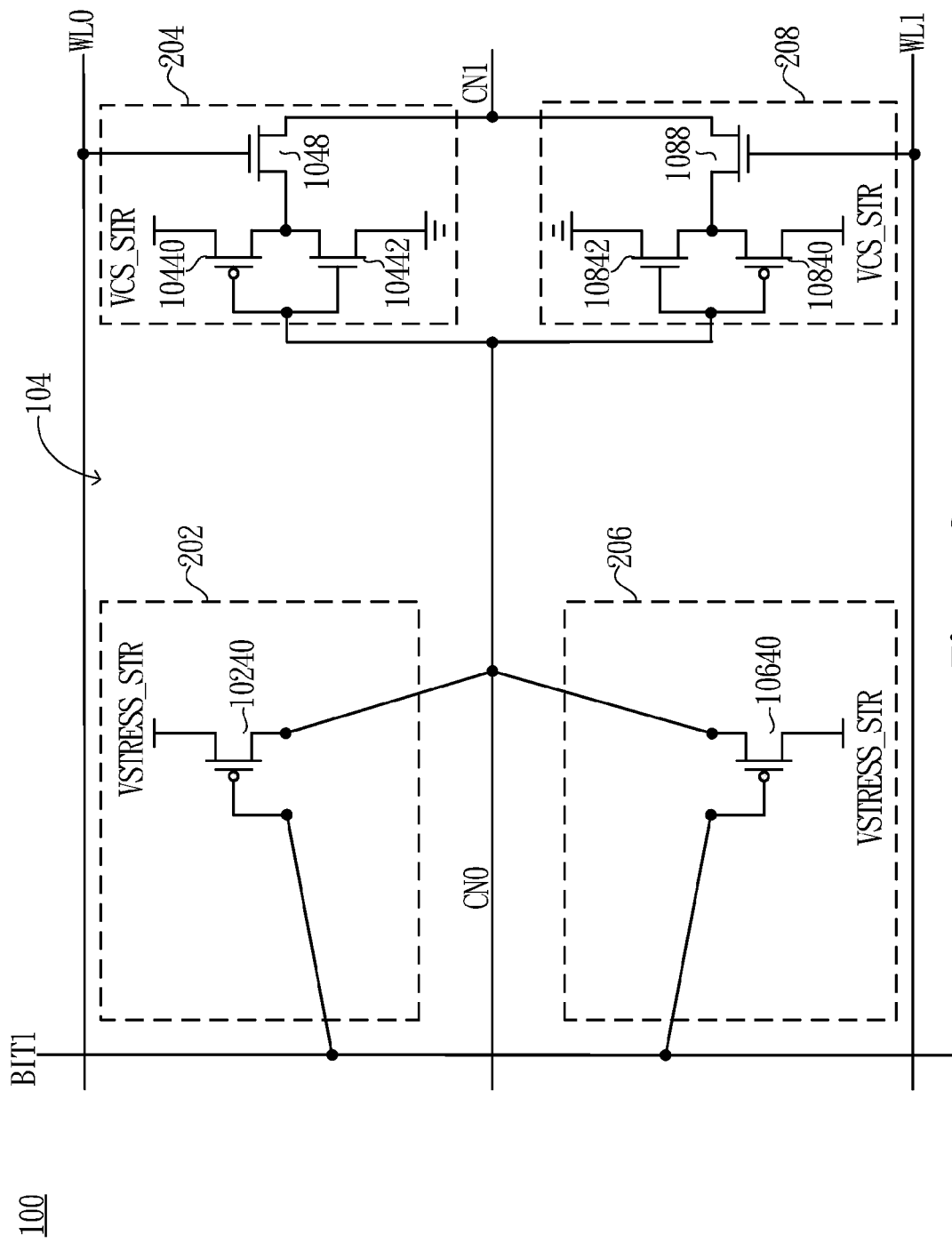
FIG. 3 is the circuit diagram of the ring oscillator drawn in accordance with FIG. 1.

Please referring to FIG. 3, which is the circuit diagram of the ring oscillator drawn in accordance with FIG. 1. FIG. 3 is the simplified diagram in accordance with FIG. 1, where the actual connected and used circuit (i.e. the circuit drawn by bolt heavy line) is drawn, and the unused circuit is deleted. When the ring oscillator is under the operation condition, the first inverter 204 and the second inverter 208 can be selected or conducted by the signals of the first word line WL0 and the second word line WL1, and the bit line BIT1 will be charged to supply sufficient current to the first control unit 202 and the second control unit 206.

Please still referring to FIG. 3, because the Negative Bias Temperature Instability (NBTI) is caused by the P-type metal-oxide-semiconductor (PMOS) transistor, upon measuring the Negative Bias Temperature Instability (NBTI), the first control unit 202 of the ring oscillator 100 controls the second pull-up transistor 10440 in the first inverter 204, and applies a voltage to the second pull-up transistor 1440. The second control unit 206 controls the second pull-up transistor 10840 in the second inverter 208, applies a voltage to the second pull-up transistor 10840, and measures the variation state of critical voltage for the output CN1, so as to measure the Negative Bias Temperature Instability (NBTI) caused by the P-type metal-oxide-semiconductor (PMOS) transistor.

Please referring to FIG. 3 continuously, relatively, the first control unit 202 controls the second pull-down transistor 10442 in the first inverter 204, and applies a voltage to the second pull-down transistor 10442. The second control unit 206 controls the second pull-down transistor 10842 in the second inverter 208, so as to measure the Positive Bias Temperature Instability (PBTI) caused by the N-type metal-oxide-semiconductor (NMOS) transistor. Thus, the ring oscillator 100 of the present invention can measure the Negative Bias Temperature Instability (NBTI) and the Positive Bias Temperature Instability (PBTI) separately on the chip, in order to realize the real-time stability.

Figure 4:
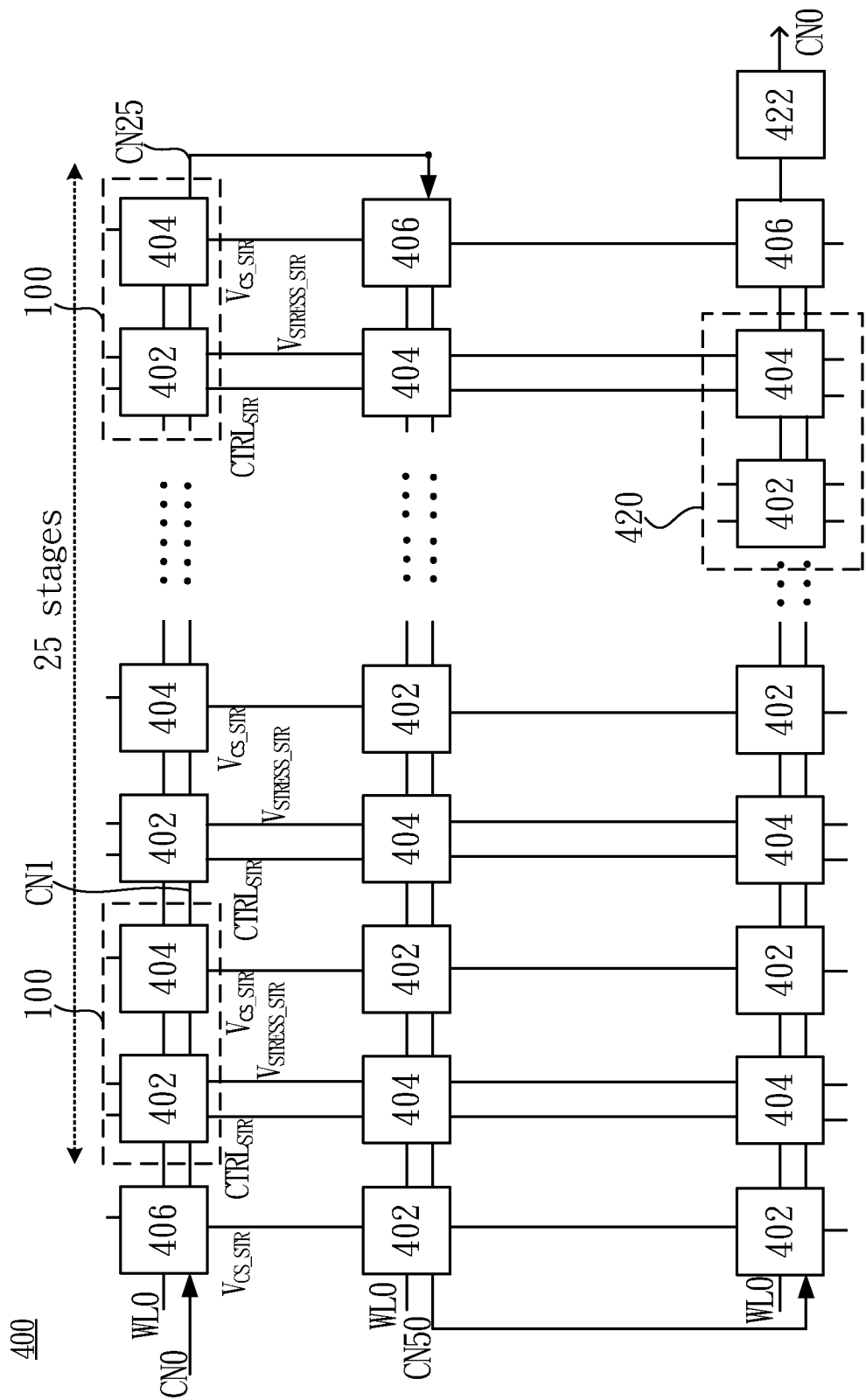
FIG. 4 is an illustration for the block diagram of ring oscillator array according to FIG. 3.

Please referring to FIG. 4, which is an illustration for the block diagram of ring oscillator array according to FIG. 3. FIG. 3 represent the circuit diagram of a single-stage ring oscillator 100. As shown in FIG. 4, the ring oscillator array 400 is formed by serially connecting multiple-stage ring oscillator 100. Among these, the ring oscillator 100 includes the control unit 402 and the inverter 404. The ring oscillator 100 serially connects a virtual unit 406. The virtual unit 406 connects an input CN0 and a first word line WL0. The inverter 404 connects an output CN1. The ring oscillator 100 of next stage is serially connected through the output CN1. In this embodiment, the ring oscillator 100 is serially connected by 25 stages, but the scope of the present invention is not limited by this. Any number of serially connected ring oscillator is also included in the scope of the present invention. The output CNn for last stage of the ring oscillator 420 is connected to a control unit 422. The output of control unit 422 is connected to an input CN0.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A ring oscillator based on a 6T SRAM for measuring a Bias Temperature Instability, the ring oscillator having at least 4 SRAM cells, wherein the SRAM cell being formed by 6-transistor structure, every SRAM cell having a first inverter including a first pull-up transistor and a first pull-down transistor, a second inverter including a second pull-up transistor and a second pull-down transistor, a first pass-gate transistor, a second pass-gate transistor, a first pass-gate transistor and a second pass-gate transistor, the first pass-gate transistor being coupled with the first inverter, and the second pass-gate transistor being coupled with the second inverter, the ring oscillator comprising:
   a first inverter;
   a first control unit, which being electrically connected with the first inverter, the first control unit being used to control the first inverter being selected, biased, and connected respectively;
   a second inverter, which being electrically connected with the first inverter; and
   a second control unit, which being electrically connected between the first control unit and the first inverter, the second control unit being used to control the second inverter being selected, biased, and connected respectively; the first control unit and the second control unit being used to measure the Negative Bias Temperature Instability and a Positive Bias Temperature Instability of the SRAM cell, and monitoring a real-time reliability of the SRAM cell.

2. The ring oscillator according to claim 1, wherein the first control unit comprises a first 6T SRAM, a voltage stress source being applied to a drain of the second pull-up transistor in a first SRAM, a gate of the second pull-up transistor in the first SRAM being coupled with a bit line.

3. The ring oscillator according to claim 2, wherein the first inverter composes a second 6T SRAM, a second pass-gate transistor of a second SRAM being coupled with a second inverter of the second SRAM, the second inverter of the second SRAM being coupled with a drain of the second pull-up transistor in the first SRAM, a gate of the second pass-gate transistor in the second SRAM being coupled with the first word line.

4. The ring oscillator according to claim 3, wherein the second control unit composes a third 6T SRAM, a voltage stress being applied to a source of a second pull-up transistor in a third SRAM, a gate of the second pull-up transistor in the third SRAM being coupled with the bit line.

5. The ring oscillator according to claim 4, wherein the second inverter composes a fourth 6T SRAM, a second pass-gate transistor of a fourth SRAM being coupled with a second inverter of the fourth SRAM, the second inverter of the fourth SRAM being coupled with a drain of a second pull-up transistor in the third SRAM, and a drain of the second pull-up transistor in the first SRAM, a gate of the second pass-gate transistor in the fourth SRAM being coupled with a second word line.

6. The ring oscillator according to claim 1, wherein the first pull-up transistor and the second pull-up transistor comprises P-type metal-oxide-semiconductor transistors.

7. The ring oscillator according to claim 6, wherein the Negative Bias Temperature Instability is generated by the first pull-up transistor or the second pull-up transistor.

8. The ring oscillator according to claim 1, wherein the first pull-down transistor, the second pull-down transistor, the first pass-gate transistor and the second pass-gate transistor comprises N-type metal-oxide-semiconductor transistors.

9. The ring oscillator according to claim 8, wherein the Positive Bias Temperature Instability is generated by the first pull-down transistor or the second pull-down transistor.

* * * * *